US009453879B2

(12) United States Patent
Leibowitz et al.

(10) Patent No.: US 9,453,879 B2
(45) Date of Patent: Sep. 27, 2016

(54) ON-DIE SYSTEM FOR MONITORING AND PREDICTING PERFORMANCE

(71) Applicant: Apple Inc., Cupertino, CA (US)

(72) Inventors: Brian S. Leibowitz, San Francisco, CA (US); Mohamed H. Abu-Rahma, Mountain View, CA (US); Michael R. Seningen, Austin, TX (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 14/556,798

(22) Filed: Dec. 1, 2014

(65) Prior Publication Data

US 2016/0154055 A1 Jun. 2, 2016

(51) Int. Cl.
G01R 31/02 (2006.01)
G01R 31/28 (2006.01)

(52) U.S. Cl.
CPC ....... G01R 31/2896 (2013.01); G01R 31/2874 (2013.01)

(58) Field of Classification Search
CPC .............. G01R 1/0491; G01R 31/265; G01R 31/3012; G01R 31/318511
See application file for complete search history.

(56) References Cited

U.S. PATENT DOCUMENTS

| 6,236,947 B1* | 5/2001 | Dowling | G01R 31/343 324/750.16 |
|---|---|---|---|
| 7,062,696 B2 | 6/2006 | Barry et al. | |
| 8,001,434 B1* | 8/2011 | Lee | G11C 29/12 714/719 |
| 8,412,991 B2 | 4/2013 | Ackerman et al. | |
| 8,712,718 B1 | 4/2014 | Camarota et al. | |
| 2007/0260932 A1 | 11/2007 | Prichard et al. | |
| 2011/0055646 A1 | 3/2011 | Mukherjee et al. | |

* cited by examiner

*Primary Examiner* — Tung X Nguyen
(74) *Attorney, Agent, or Firm* — Meyertons, Hood, Kivlin, Kowert & Goetzel, P.C.

(57) ABSTRACT

An apparatus and method for determining performance of system is disclosed. While operating in a test mode, a plurality of test results may be received and stored in a memory. Each test result may be indicative of a performance of the system when the system is operating under a respective test condition. Also, during the test mode, a respective value of an operating parameter of a predetermined system element at each test condition. An association between each test result and a corresponding detected respective value of the operating parameter may be provided. During a normal operating mode, an operating value of the operating parameter may be determined. A performance level of the system based on a test value retrieved from memory dependent upon the operating value and the association may then be determined.

20 Claims, 5 Drawing Sheets

ON-DIE SYSTEM FOR MONITORING AND PREDICTING PERFORMANCE

BACKGROUND

1. Technical Field

Embodiments described herein relate to computing systems, and more particularly, to techniques for determining the performance of a computing system.

2. Description of the Related Art

Computing systems may include one or more integrated circuits. Such integrated circuits may include specialized devices configured to perform a specific task, or systems-on-a-chip (SoC), which may integrate a number of different functions, such as, e.g., graphics processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Prior to assembling a computing system, each included integrated circuit may be tested. Such testing may be performed at various stages of the assembly process. For example, an integrated circuit may be tested shortly after fabrication using a semiconductor manufacturing process has completed. Such testing is often referred to as "wafer probe" any may identify any instances of a particular integrated circuit that are faulty due to the manufacturing process. Test programs executed on external testers may be crafted to identify short circuits, open circuits, or other common manufacturing related failure mechanisms. In some cases, specialized test circuits, such as, e.g., scan chains, may be included in the integrated circuit as aid in testing.

Once an integrated circuit has passed initial wafer probe, it may be assembled into a package, or mounted on a circuit board or other substrate. At this point, the integrated circuit may be further tested to determine its particular operating parameters. For example, an integrated circuit may be tested over a range of power supply voltage levels or temperatures. The process of testing an integrated circuit over a range of values is commonly referred to as characterization. At each combination of voltage level, temperature, etc., one or more tests may be executed. By testing the integrated circuit at a variety of operational conditions, the range of allowable values of the operational conditionals may be determined.

SUMMARY OF THE EMBODIMENTS

Various embodiments of a method and apparatus for determine the performance level of circuit or system are disclosed. Broadly speaking, an apparatus and a method are contemplated in which, an interface unit is configured to receive a plurality of test results during a test mode. Each of the test results may be indicative of a performance of the system when the system is operating under a respective test condition of a plurality of test conditions. A monitor circuit may be configured to, during the test mode, detect a respective value of an operating parameter of a predetermined system element while the system operating under the respective test condition corresponding to each test result. Circuitry may be configured to store each test result in a memory and provide an association between each detected respective value of the operating parameter and a corresponding test result. The monitor circuit may be further configured to measure, during a normal operating mode, an operating value of the operating parameter. The circuitry may be further configured to retrieve at least one test result from the memory dependent upon the association and the operating value of the operating parameter, and determine a performance level based on the at least one test result.

In one embodiment, the circuitry may be further configured to modify at least one test result of the plurality of test results. In a further embodiment, the circuitry may be further configured to modify the respective value of the operating parameter.

In another embodiment, the circuitry may be further configured to adjust one or more operating conditions of the system responsive to a determination that the performance level of the system does not meet a predetermined level. In a further non-limiting embodiment, the circuitry may be further configured to send a deactivation signal dependent upon the performance level of the system.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Individual components of a computing system may be tested numerous times during the manufacturing and assembly process to ensure the computing system will function as desired. In addition to functional testing post-manufacture, individual components may be tested at a variety of operating conditions.

Once a component is installed in a computing system, differences in operation conditions, such as, e.g., temperature, may result in differences in performance. For example, an increase in temperature may result in a reduction in current carrying capability of an individual transistor, thereby slowing overall performance of a circuit. During operation, adjustments may be made in one operating condition to offset variation in another operating parameter. To determine when an adjustment in an operating condition is necessary, a monitor circuit that mimics the behavior of a critical circuit within an integrated circuit may be employed to infer the performance of the critical circuit. Based on measurements of the monitor circuit, overall performance may be predicted.

Such monitor circuits, however, may be difficult to calibrate to the circuit that is to be mimicked, making performance prediction difficult. Local variation within an integrated circuit due to random dopant variation and the like may result in different performance for transistor that should otherwise have similar electrical characteristics. Moreover, if the a change is made from one generation of the integrated circuit to another, the canary circuit may have to be re-designed and re-optimized as well. The embodiments illustrated in the drawings and described below may provide techniques for predicting performance of an integrated circuit in a computing system that are not sensitive to deviations between the behavior of the monitor circuit and the performance of the critical circuit.

Figure 1:
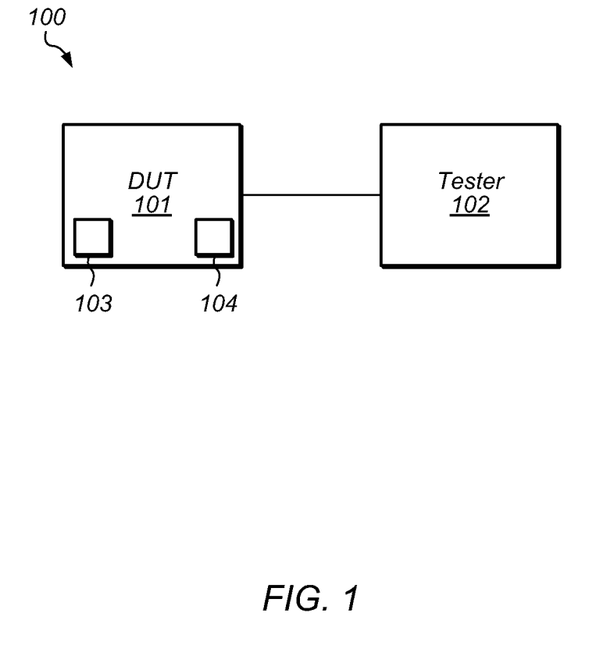
FIG. 1 illustrates an embodiment of test system.

Turning to FIG. 1, an embodiment of a test system is illustrated. In the illustrated embodiment, test system 100 includes Device Under Test (DUT) 101 and tester 102. DUT 101 includes monitor circuit 103 and test memory 104. In some embodiments, DUT 101 may be an integrated circuit, such as, e.g., a System-on-a-chip (SoC) commonly used in many mobile computing applications. DUT 101 may, in other embodiments, be a computing system that includes multiple integrated circuits, such as, processors, memories, and the like, coupled together on one or more circuit boards or other substrates. Such computing systems may be used in mobile telephones, table computers, desktop computers, etc.

During operation, tester 102 may transmit test instructions and data to DUT 101. For example, tester 102 may transmit a predetermined set of data to be stored into a memory (not shown) of DUT 101 at predetermined locations within the memory. Once the data has been stored in the memory, tester 102 may transmit further instructions to read the previously stored data, and send the retrieved data back to tester 102. The retrieved data may then be compared to the originally transmitted data to determine storage cells in the memory that are not functioning correctly. Tester 102 may, in other embodiments, transmit instructions and data that exercise logic circuits within DUT 101 to determine if the logic circuits are functioning correctly.

Additionally, tester 102 may perform any or all of the previously described tests at different environment and operational conditions (collectively "test conditions"). The process may be referred to as "characterization," and may, in some embodiments, provide information as to a range of operations conditions where DUT 101 will operate correctly. Such information may also be used to determine any variation in the performance of DUT 101 as environmental or operating conditions vary.

At each test condition, tester 102 may provide test results to DUT 101. Such test results may be stored in test memory 104. In some embodiments, the test results may be stored in test memory 104 dependent upon data received from monitor circuit 103. At a given test condition, monitor circuit 103 may measure a value of a given operational parameter, such as, e.g., temperature. The measured value(s) may then be associated with the test results by storing corresponding values and test results together in test memory 104. As described below in more detail, test results may be modified prior to storage in test memory 104.

The measured values may be associated with corresponding test results in various ways. In some embodiments, a given test result may be stored along with corresponding values in a particular entry of a table. An example of a table-based association method is illustrated in table 1. In the example depicted in table 1, each entry in the table corresponds to a particular association of values and test results. For example, values A and B, received from respective monitor circuits, are associated test result W and collectively stored in entry 1 of table 1. In a similar fashion, other values are stored along with corresponding test results in different entries of table 1. It is noted that the association method depicted in table 1 is merely an example. In other embodiments, any suitable method of storing corresponding values and test data in test memory 104 may be employed.

TABLE 1

Association of results with test data

| Entry No. | Value 1 | Value 2 | Test Results |
| --- | --- | --- | --- |
| 1 | A | K | W |
| 2 | B | L | X |
| 3 | C | M | Y |
| 4 | D | N | Z |

Test memory 104 may be designed in accordance with one of various design styles. For example, in some embodiments, test memory 104 may be a Static Random Access Memory (SRAM), Electrically Erasable Programmable Read-only Memory (EEPROM), or a FLASH memory. Although depicted as being included in DUT 101, in various embodiments, test memory 104 may be external to DUT 101. In such cases, a dedicated communication interface may be provided to allow for the exchange of data between DUT 101 and test memory 104.

It is noted that the embodiment illustrated in FIG. 1 is merely an example. In other embodiments different numbers of DUTs and different connections to tester 102 may be employed.

Figure 2:
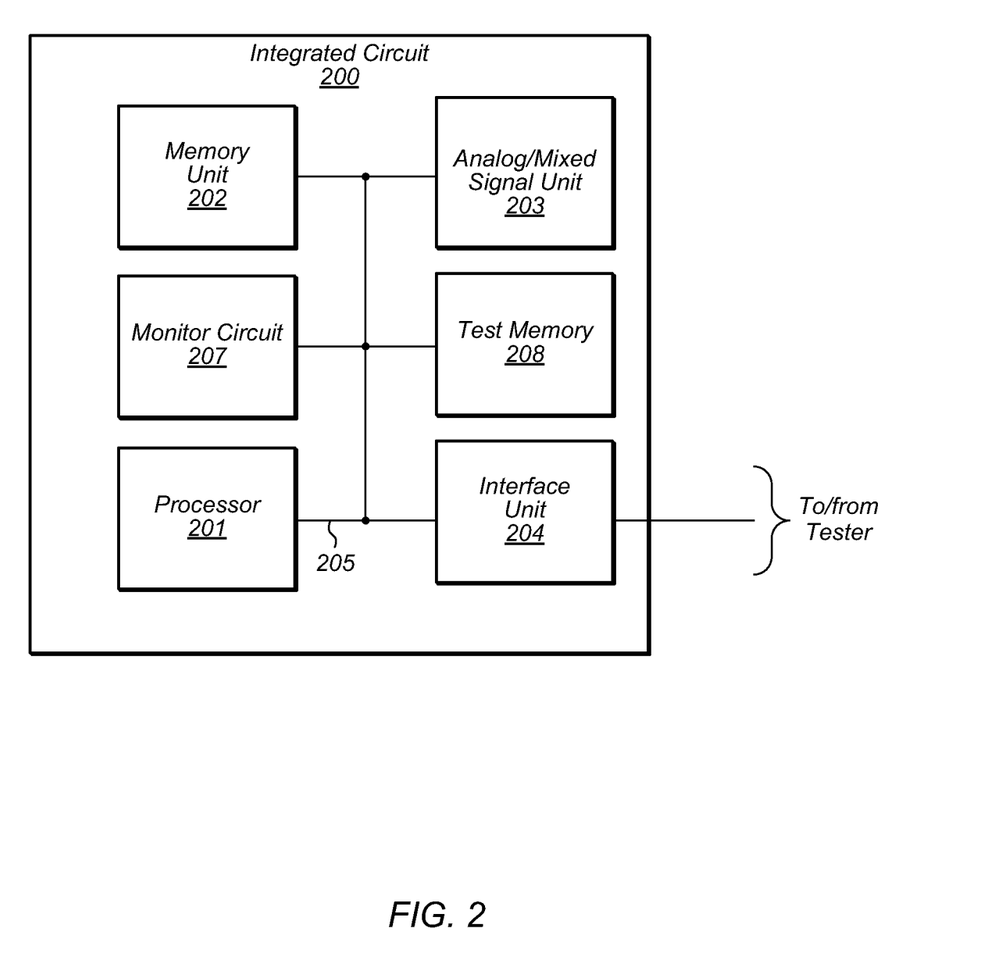
FIG. 2 illustrates an embodiment of an integrated circuit.

A block diagram of an integrated circuit is illustrated in FIG. 2. In some embodiments, integrated circuit 200 may correspond to DUT 101 as illustrated in FIG. 1. In the illustrated embodiment, integrated circuit 200 includes a processor 201 coupled to memory unit 202, and analog/mixed-signal unit 203, and Interface Unit 204 through internal bus 205 (also referred to herein as a "switch fabric"). It is noted that although a single internal bus is depicted in the embodiment illustrated in FIG. 2, in other embodiments, any suitable number of internal busses may be employed to allow for communication between various functional units within integrated circuit 200. In some embodiments, different internal busses may employ different communication protocols. Some embodiments may include dedicated busses between functional units that may allow for high-bandwidth point-to-point communication between functional units. Although monitor circuit 207 and test memory 208 are depicted as being coupled to bus 205, in other embodiments, monitor circuit 207 and test memory 208 may employ one or more of the aforementioned communication topologies. In various embodiments, integrated circuit 200 may be configured for use in a desktop computer, server, or in a mobile computing application such as, e.g., a tablet or laptop computer.

Processor 201 may, in various embodiments, be representative of a general-purpose processor that performs computational operations. For example, processor 201 may be a central processing unit (CPU) such as a microprocessor, a microcontroller, an application-specific integrated circuit (ASIC), or a field-programmable gate array (FPGA). In some embodiments, processor 201 may execute program instructions, which may be stored in memory unit 102 to perform various computational tasks. Processor 201 may, in some embodiments, perform primary computation tasks, such as, e.g., executing operating system instructions, for integrated circuit 200.

Memory unit 202 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an integrated circuit illustrated in FIG. 2, a single memory unit is depicted. In other embodiments, any suitable number of memory blocks may be employed.

Analog/mixed-signal unit 203 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal unit 203 may be configured to perform power management tasks with the inclusion of on-chip power supplies and voltage regulators. Analog/mixed-signal block 203 may also include, in some embodiments, radio frequency (RF) circuits that may be configured for operation with wireless networks.

Interface unit 204 may be configured to coordinate data transfer between integrated circuit 200 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, interface unit 204 may be configured to implement a version of Universal Serial Bus (USB) protocol or IEEE 1394 (Firewire®) protocol.

Interface unit 204 may also be configured to coordinate data transfer between integrated circuit 200 and one or more devices (e.g., other computer systems or integrated circuits) coupled to integrated circuit 200 via a network. In one embodiment, interface unit 204 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, interface unit 204 may be configured to implement multiple discrete network interface ports. Interface unit 204 may, in various embodiments, be configured to provide a test interface for an external tester. Such a test interface may allow for the transfer of test instructions, test data, and test results from the tester to integrated circuit 200. In some embodiments, results from testing, such as data in a scan chain, for example, may be sent via interface unit 204 to a tester for further analysis.

Monitor circuit 207 may, in various embodiments, be configured to measure a value for an operating parameter for a representative circuit topology. For example, monitor circuit 207 may include a voltage meter configured to measure a voltage level of a given node within integrated circuit 207. In other embodiments, monitor circuit 207 may include other circuit types, such as, oscillators, delay circuits, temperature sensors, and the like, and the operating parameter may be any measurable parameter of the monitor circuit, such as, oscillation frequency, for example. Although a single monitor circuit is depicted in the embodiment illustrated in FIG. 2, it is noted that, in other embodiments, any suitable number of monitor circuits may be employed.

Test memory 208 may be configured to store test results received via interface unit 204. In various embodiments, received data may be stored in test memory 208 dependent upon measured values from monitor circuit 207. Such values from monitor circuit 207 may be used to create indices to store test results. For example, during a particular test, monitor circuit 207 may measure a value for an operational parameter. The test result corresponding to the particular test may be stored in test memory 208 using the measure value as part of a map that maps the measured value to a storage location within test memory 208. In some embodiments, the map may be stored in a predefined location within test memory 208 or, in other embodiments, the map may be stored in another memory location, such as, memory unit 202, for example. Test memory 208 may, in various embodiments, include any suitable type of memory such as, EEPROM, FLASH, or e-fuse, for example.

Test memory 208 may be designed in accordance with one of various design styles. In some embodiments, test memory 208 may include multiple SRAM data storage cells, latches, flip-flops, or any other suitable storage circuit.

It is noted that the embodiment illustrated in FIG. 2 is merely an example. In other embodiments, different functional units and different configurations of functional units are possible and contemplated.

Figure 3:
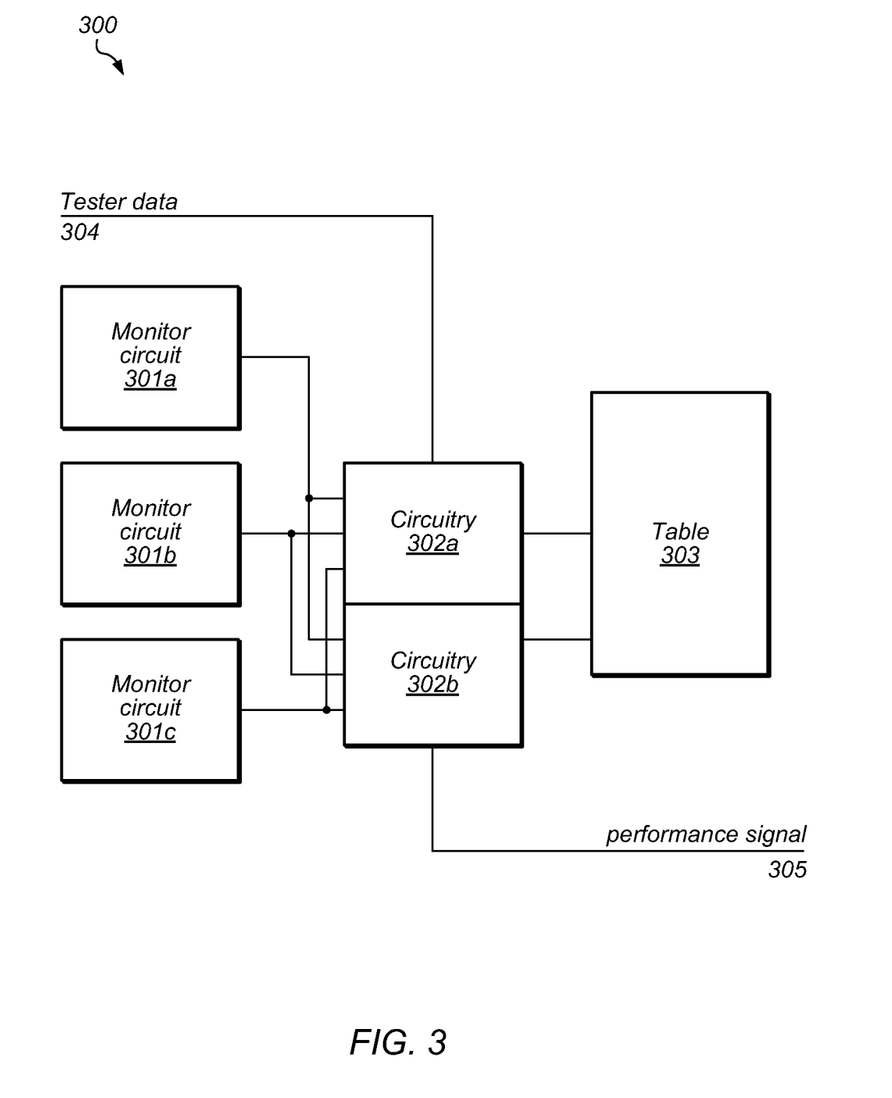
FIG. 3 illustrates an embodiment of a test circuit.

Turning to FIG. 3, an embodiment of a test circuit is illustrated. In the illustrated embodiment, test circuit 300 includes monitor circuits 301a-c, circuitry 302a-b, and table 303. In some embodiments, each of monitor circuits 301a-c may correspond to monitor circuit 207 as depicted in the embodiment illustrated in FIG. 2, and table 303 may correspond to test memory 208 as depicted in the embodiment illustrated in FIG. 2.

During initial characterization of a device, such as, e.g., DUT 101 as illustrated in FIG. 1, circuitry 302a may receive tester data 304 from an external tester. Tester data 304 may be results from tests performed by the external tester at a given combination of test conditions (i.e., temperatures, supply voltage levels, and the like). Circuitry 302a may also receive data from one or more of monitor circuits 301a-c. Since monitor circuits 301a-c are included in the device, the circuits are subject to the same test conditions at which the tests were performed, thereby creating a correspondence between tester data 304 and data from monitor circuits 301a-c, for a given test condition.

Circuitry 302a may then associate the data received from monitor circuits 301a-c with portions of tester data 304 by collectively storing the associated data into table 303. In some embodiments, circuitry 302a may be configured to modify data received from monitor circuits 301a-c as part of the index generation process. Such modifications may include scaling, adding an offset, or any other suitable adjustment of the data. Alternatively or additionally, circuitry 302 may be further configured to modify (i.e., scale, add an offset, etc.) to tester data 304 prior to storing tester date 304 in table 303.

Once characterization has been performed, circuitry 302b may use data stored in table 303 to assess the performance of the device during normal operation. Circuitry 302b may, in various embodiments, be configured to receive measured parameter data from monitor circuits 301a-c. The values may be received continuously during operation, or may be received at regular time intervals, or may be received in response to a request. Circuitry 302b may then use the received values to select test data to retrieve from table 303. Since the test data was originally stored dependent upon values measured by monitor circuits 301a-c for a given test condition, test data retrieved from table 303 using current values from monitor circuits 301a-c may correspond test data for current operating conditions of the device. In some embodiments, circuitry 302 may adjust or "round off" data retrieved from monitor circuits 301a-c as part of a determination of which location within table 303 to access. In some embodiments, circuitry 302b may retrieve data from multiple locations in table 303 in order to derive the performance signal. For example, circuitry 302b may interpolate between multiple data stored in the table based on how closely the received parameter values from monitor circuits 301a-c match the parameter values that were received during the characterization process.

In various embodiments, circuitry 302b may assess the performance of the device dependent upon data retrieved from table 303. Circuitry 302b may compare test data retrieved with a programmable threshold value. In some embodiments, if the retrieved test data is greater than (or dependent upon the type of data, less than) the programmable threshold value, circuitry 302 may assert performance signal 305 indicating that the performance level of the circuit does not meet desired levels. In response to the assertion of performance signal 305, a power management unit, or other suitable functional unit, may adjust one or more operational parameters, such as, a voltage level of a power supply, a frequency of a clock signal, etc., to adjust the performance level of the device. In other embodiments, the device may power off in response to the assertion of performance signal 305. Circuitry 302 may, in some embodiments, send performance signal 305 to other devices within a computing system, thereby allowing functions allocated the device to be transferred to the other devices within the computing system prior to shutdown.

Table 303 may include a plurality of data storage cells. In various embodiments, such data storage cells may be static, dynamic, non-volatile, or any suitable data storage cells. Table 303 may, in some embodiments, include one or more registers, each of which may include multiple latches, flip-flops, or other suitable storage circuits. In some embodiments, table 303 may store a map at a predefined location. The map may provide a translation between data received from monitor circuits 301a-c and storage locations within table 303.

Circuitry 302a-b may be designed in accordance with one of various design styles. In some embodiments, circuitry 302a-b may include dedicated sequential logic circuits (also referred to herein as a "state machine") configured to perform the aforementioned tasks. Circuitry 302a-b may, in other embodiments, include a general purpose process configured to execute a plurality of program instructions retrieved from a memory in order to perform the aforementioned functions.

Each of monitor circuits 301a-c may include dedicated circuitry configured to measure an operating parameter of a device or local test circuit. For example, one of monitor circuits 301a-c, may measure temperature at a specific location within a device, while another one of monitor circuits 301a-c may measure a voltage level of a local power supply. In some embodiments, monitor circuits 301a-c may include a local test circuit, such as, e.g., a ring oscillator, and be configured to measure a frequency at which the ring oscillator is operating. Monitor circuits 301a-c may, in some embodiments, be configured to operating continuously, sending data values resulting from measurements to circuits 302. In other embodiments, monitor circuits 301a-c may be idle until requested to perform a measurement by circuits 302 or another functional unit within a device.

It is noted that the embodiment depicted in FIG. 3 is merely an example. In other embodiments, different numbers of monitor circuits and different configurations of monitor circuits may be employed.

Figure 4:
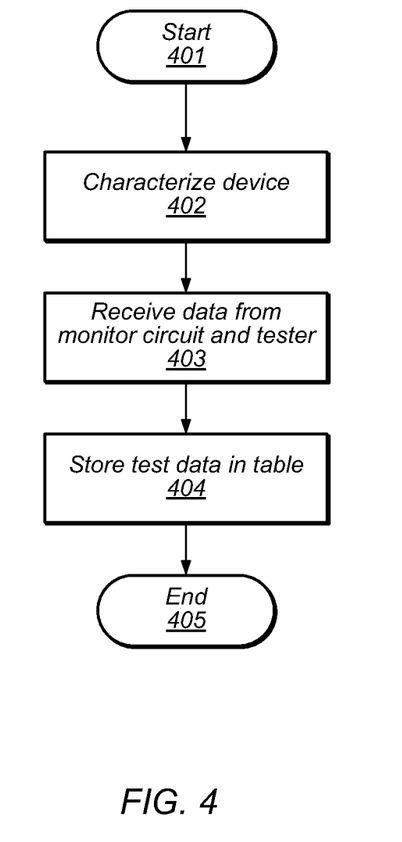
FIG. 4 illustrates a flow diagram depicting an embodiment of a method for storing test data.

A flow diagram depicting an embodiment of a method for storing test data is illustrated in FIG. 4. Referring collectively to embodiment of FIG. 3, and the flow diagram of FIG. 4, the method begins in block 401.

A device, such as, e.g., DUT 101 as illustrated in FIG. 1, may then be characterized (block 402). During characterization, various tests of circuitry, functional units, and the like, within the device may be tested by an external tester, such as, tester 102 of FIG. 1, for example. Such tests may be performed at a variety of test conditions. For example, the set of tests may be performed at a nominal supply voltage level and room temperature, and then be repeated a larger than nominal supply voltage and a temperature warmer than room temperature.

In some embodiments, some of the tests may be performed or supported by circuitry included in the device, and measurement or tests performed by circuitry of the device may be reported to the external tester. During testing, DUT 101 may operate in a test mode. As used and described herein, a test mode is an operating mode in which test instructions and data are received from an outside source, such as, e.g., a tester, and the instructions executed, and the results reported to the outside source. Specialized test circuits within DUT 101, such as, e.g., a scan chain, may be activated during test mode operation.

Data may then be received by circuitry 302 from one or more of monitor circuits 301a-c, and tester data 304 (block 403). In various embodiments, data received from monitor circuits 301a-c may correspond to each of the various test conditions used during characterization. For example, data may be received from a monitor circuit 301a at a first temperature supply voltage combination. After the temperature and supply voltage have change for a new characterization point, updated data may be received from monitor circuit 301a. The data received from monitor circuits 301a-c may, in various embodiments, include a value for any suitable parameter of the device. For example, monitor circuits 301a-c may measure temperature, power supply voltage level, frequency of a clock signal, and the like. By measuring such values, parameter associated with the device may be determined on the device for each test condition used in the characterization.

Circuitry 302a may then store tester data 304 in table 303 (block 405). In various embodiments, circuitry 302a may use data received from monitor circuits 301a-c to create an association between the data from the monitor circuits and the test data. In some embodiments, the association may include storing tester data 304 and the measured values from monitor circuits 301a-c together in entries in table 303 Circuitry 302 may create a map between data received from monitor circuits 301a-c to tester data stored within table 303.

In some embodiments, circuitry 302a may modify the tester data 304 prior to storage in table 303. Such modifications may include scaling (either up or down) tester data 304, or adding or subtracting an offset (also referred to herein as a "bias") to the data. As described below in more detail, by modifying tester data 304, margin may be added into the data, thereby allowing the triggering an action in response to an determined performance condition of the device at any desired level relative to a particular value of tester date 304.

Circuitry 302a may additionally modify data received from monitor circuits 301a-c in prior to storage. In various embodiments, in addition to scaling and biasing, circuitry 302 may combine data from each of monitor circuits 301a-c with one of various algorithms.

Once tester data 304 has been stored in the table 303, the method may then conclude in block 405. It is noted that the method illustrated in the flow diagram of FIG. 4 is merely an example. In other embodiments, different operations and different orders of operations are possible and contemplated.

Figure 5:
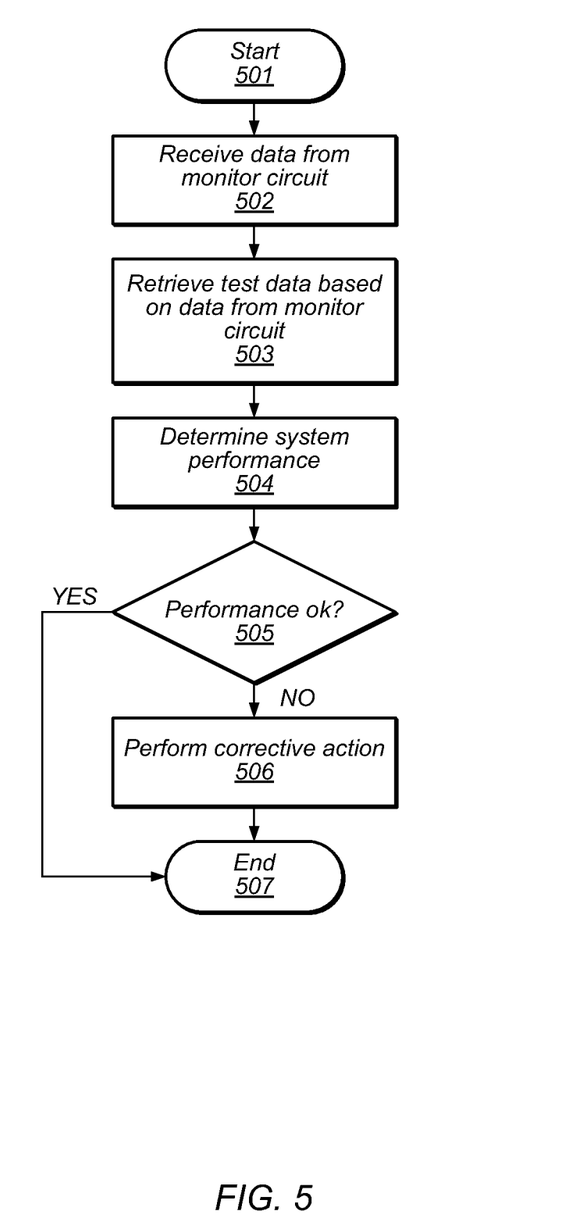
FIG. 5 illustrates a flow diagram depicting an embodiment of a method for operating a circuit using stored test data.

Turning to FIG. 5, a flow diagram depicting an embodiment of a method for operating a circuit based on stored test data is illustrated. Referring collectively to the embodiment of FIG. 3, and the flow diagram depicted in FIG. 5, the method begins in block 501.

Data may then be received from monitor circuits 301a-c by circuitry 302 (block 502). During operation, each of monitor circuits 301a-c may generate data values for operational parameters of a device. As described above, monitor circuits 301a-c may track temperature, voltage levels, frequencies, and the like. Circuitry 302b may receive such data at regular time intervals, or may receive the data continuously and act on the data only when predetermined threshold values have been reached. In some embodiments, circuitry 302b may scale or bias data received from monitor circuits 301a-c in accordance with how such data was processed when tester data 304 was originally stored.

Once circuitry 302b has been received data from monitor circuits 301a-c, previously stored test data may be retrieved from table 303 using the data received from monitor circuits 301a-c based on the association between values of the operating parameter and the test results. In various embodiments, circuitry 302b may generate an index using the association information and the newly received data from monitor circuits 301a-c, and the index may then be employed to retrieve a specific test value from table 303.

Using the retrieved test data from table 303, circuitry 302b may then determine a performance level of the device or system (block 504). By retrieving test data from table 303 using data received from monitor circuits 301a-c, circuitry 302b may determine if the device is currently in a regime where the initial characterization indicated that device may not have as much operating margin between its current performance capability and the performance at which is currently being operated. The device may, in some embodiments, be close to failing. Circuitry 302b may generate a performance value based on the retrieved test data by scaling the retrieved value or performing any other suitable analysis. For example, circuitry 302b may retrieve data from table 303 using several successive collections of data from monitor circuits 301a-b, and perform a running average, generate a Probability Density Function (PDF), or any other suitable analysis on the retrieved data to generate the performance value.

The method may then depend on the determined performance signal (block 505). If the determined performance signal indicates that the operating margin is acceptable (i.e., the performance capability is sufficiently greater than a required or current operating performance), the method may then conclude in block 507. If, however, the determined performance capability is unacceptable, a corrective action may be performed (block 506). In some embodiments, circuitry 302b may send a signal to a power management unit or other suitable circuit, indicating that the device is performing at a diminished operating margin and that a power supply voltage should be increased as corrective action to improve margin by increasing performance capability. Circuitry 302b may, in other embodiments, determine that the device may be close to failure, and send a signal to halt the device or switch to a different mode of operation with less required performance. Alternatively, or additionally, circuitry 302 may send a signal to one or more other devices indicating that halting or switching to a low performance mode is necessary. In some embodiments, such a signal may be used to re-route network traffic, move execution threads from the affected device, and the like. In other embodiments, correction action may include reducing current performance of the critical circuit to improve the margin. Once any corrective action has been initiated, the method may conclude in block 507.

Although the operations illustrated in the flow diagram of FIG. 5 are depicted as being performed in a serial fashion, in other embodiments, one or more of the illustrated operations may be performed in parallel. In some embodiments, the method depicted in FIG. 5 may be performed repeatedly in a continuous fashion or at regular intervals during operation of an integrated circuit, such as, integrated circuit 200 as illustrated in FIG. 2.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an interface unit configured to, during a test mode, receive a plurality of test results, wherein each test result of the plurality of test results is indicative of a performance of a system when the system is operating under a respective test condition of a plurality of test conditions;
    a monitor circuit configured to, during the test mode, detect a respective value of an operating parameter of a predetermined system element when the system is operating under the respective test condition corresponding to each test result; and circuitry, including a memory, wherein the memory is configured to store the plurality of test results, and wherein the circuitry is configured to provide an association between detected respective value of the operating parameter of the predetermined system element and the corresponding test result when the system is operating under each respective test condition, wherein:

the monitor circuit is further configured to, during a normal operation mode, detect an operating value of the operating parameter of the predetermined system element; and the circuitry is further configured to:

retrieve at least one test result from the memory based upon the detected operating value of the operating parameter and the association; and determine a performance capability of the system dependent upon the at least one test result.

2. The apparatus of claim 1, wherein the circuitry is further configured to modify at least one test result of the plurality of test results prior to the plurality of test results being stored in the memory.

3. The apparatus of claim 1, wherein to provide the association, the circuitry is further configured to modify the respective value of the operating parameter.

4. The apparatus of claim 1, wherein the circuitry is further configured to adjust one or more operating conditions of the system responsive to a determination that an operating margin of the system does not meet a predetermined level.

5. The apparatus of claim 1, wherein the circuitry is further configured to send a deactivation signal dependent upon the performance capability of the system.

6. The apparatus of claim 1, wherein the circuitry is further configured to send information indicative of the performance capability of the system to a circuit external to the system.

7. A method, comprising:

testing a system, operating in a test mode, to generate a plurality of test results, wherein each test result is indicative of a performance of the system operating under a respective test condition of a plurality of test conditions;

detecting a respective value of an operating parameter of a predetermined system element when the system is operating under the respective test condition corresponding to each test result;

determining an association between a given test result and the corresponding test result when the system is operating under each respective test condition;

determining an association between detected respective values of the operating parameter of the predetermined system element and the corresponding test result when the system is operating under each respective test condition;

storing, in a memory, test results of the plurality of test results;

detecting, when the system is operating in a normal operating mode, an operating value of the operating parameter of the predetermined system element;

retrieving at least one test result from the memory based upon the detected operating value of the operating parameter and the association; and determining a performance level of the system dependent upon the at least one test result.

8. The method of claim 7, further comprising modifying at least one test result of the plurality of test results.

9. The method of claim 7, wherein providing the association comprises modifying at least at least one respective value of the operating parameter.

10. The method of claim 9, wherein modifying the at least one respective value of the operating parameter comprises adding an offset to the at least one respective value of the operating parameter.

11. The method of claim 7, further comprising, adjusting one or more operating conditions of the system responsive to a determining that the performance level of the system does not meet a predetermined level.

12. The method of claim 7, further comprising, deactivating the system dependent upon the performance level of the system.

13. The method of claim 7, further comprising, signaling, to a circuit external to the system, information indicative of the performance level of the system.

14. The method of claim 7, wherein storing each test result of the plurality of test results in the memory comprises modifying at least one test result of the plurality of test results.

15. A system, comprising:

a first processing unit; and a second processing unit including a memory, wherein the second processing unit configured to:

receive, during a test mode, a plurality of test results, wherein each test result of the plurality of test results is indicative of a performance of the second processing unit operating under a respective test condition of a plurality of test conditions;

detect, during the test mode, a respective value of an operating parameter of a predetermined system element when the system is operating under the respective test condition corresponding to each test result;

store, in the memory, each test result of the plurality of test results;

provide an association between detected respective values of the operating parameter of the predetermined system element and the corresponding test result when the system is operating under each respective test condition;

detect, during a normal operation mode, an operating value of the operating parameter of the predetermined system element;

retrieve at least one test result from the memory dependent upon the operating value of the operating parameter and the association; and determine a performance level of the second processing unit dependent upon the at least one test result.

16. The system of claim 15, wherein the second processing unit is further configured to modify at least one test result of the plurality of test results prior to the plurality of test results being stored in the memory.

17. The system of claim 15, wherein to provide the association, the second processing unit is further configured to modify the respective value of the operating parameter.

18. The system of claim 15, wherein the second processing is further configured to adjust one or more operating conditions of the second processing unit responsive to a determination that the performance level of the second processing unit does not meet a predetermined level.

19. The system of claim 15, wherein the second processing unit is further configured to deactivate dependent upon the performance level of the second processing unit.

20. The system of claim 15, wherein the second processing unit is further configured to send information indicative of the performance level of the second processing unit to the first processing unit.

* * * * *